United States Patent [19]

Aoyama

[11] Patent Number: 5,414,554
[45] Date of Patent: May 9, 1995

[54] OPTICAL SEMICONDUCTOR AMPLIFIER

[75] Inventor: Tsutomu Aoyama, Tokyo, Japan

[73] Assignee: NEC Corporation, Tokyo, Japan

[21] Appl. No.: 135,447

[22] Filed: Oct. 13, 1993

[30] Foreign Application Priority Data

Oct. 13, 1992 [JP] Japan .................. 4-273951

[51] Int. Cl.6 ............................... H01L 31/00
[52] U.S. Cl. ..................... 359/344; 359/177
[58] Field of Search ............ 359/337, 344, 349, 177, 359/187, 194

[56] References Cited

U.S. PATENT DOCUMENTS

| 4,162,460 | 7/1979 | Gonda | 331/94.5 |
| 4,736,164 | 4/1988 | Henning | 330/4.3 |
| 4,886,334 | 12/1989 | Aoki | 350/96.15 |
| 4,947,134 | 8/1990 | Olsson | 330/4.3 |

FOREIGN PATENT DOCUMENTS

| 0305995 | 3/1989 | European Pat. Off. |
| 0377948 | 7/1990 | European Pat. Off. |
| 0469793 | 2/1992 | European Pat. Off. |
| 3731311 | 3/1989 | Germany |
| 2-291510 | 12/1990 | Japan |

OTHER PUBLICATIONS

S. Tsuji et al., "High-gain, polarization-independent . . . and angled buried facets", 1990 Technical Digest of Optical Amplifiers and Their Applications, Aug., 1990, pp. PdP5-1 to PDP5-4.
Patent Abstracts of Japan, vol. 6, No. 47 (E-99), Mar. 26, 1982 and JPA 56-162554.
Patent Abstracts of Japan, vol. 7, No. 140 (E-182) Jun. 18, 1983 (JP-A-58-052890).
Patent Abstracts of Japan, vol. 13, No. 353 (P-913) Aug. 8, 1989 (JP-A-1-112534).
Matsueda, "AlGaAs OEIC Transmitters", Jrnl of Lightwave Tech, vol. 5, No. 10, Oct. 1987, pp. 1382-1390.
U. Killat et al., "Binary Phase Gratings For Use In Fiber Optic Communication Systems", Optical Communication conference, Sep. 17, 1979, Amsterdam, NL, p. 21.2-1.

Primary Examiner—Mark Hellner
Attorney, Agent, or Firm—Sughrue, Mion, Zinn, Mapeak & Seas

[57] ABSTRACT

An optical semiconductor amplifier of the present invention comprises an input optical waveguide medium for feeding input light. A first optical branching circuit which is included a first optical coupler splits the input light into two. An optical semiconductor amplifier amplifies one of two light split by the first optical branching circuit. A first photodetector receives the other of the two light and generates a corresponding first electric signal. A second optical branching circuit which is included a second optical coupler splits the light amplified from the optical semiconductor amplifier into two. A second photodetector receives one of two light split by the second optical branching circuit, and generates a corresponding second electric signal. An output optical waveguide receives the other of the two light split by the second optical branching circuit. A feedback control circuit controls an injection current to the optical semiconductor amplifier in response to the first and second electric signals.

18 Claims, 3 Drawing Sheets

OPTICAL SEMICONDUCTOR AMPLIFIER

BACKGROUND OF THE INVENTION

The present invention relates to an optical semiconductor amplifier for directly amplifying an optical signal on a transmission path included in an optical fiber communication system.

It has been customary with an optical fiber communication system to amplify an optical signal on a transmission path by converting the optical signal to an electric signal, amplifying the electric signal, and then reconverting the electric signal to an optical signal. The problem with this amplifying procedure is that hardware for the optical-to-electrical and electrical-to-optical signal conversion is indispensable, resulting in a complicated and bulky amplifier. To eliminate this problem, there has been proposed an optical semiconductor amplifier using a GaAs or InP optical semiconductor for directly amplifying light, i.e., without converting it to electricity. The optical semiconductor amplifier has an optical amplifier medium implemented by a semiconductor as small as a semiconductor laser diode and is driven by an injection current. This kind of amplifier is miniature and needs only a simple drive system, although it is inferior to an optical fiber amplifier using an erbium-doped optical fiber in respect of gain and saturation optical output. An optical fiber communication system using a conventional optical semiconductor amplifier determines a gain in terms of injection current by monitoring only the gain of the amplifier. Specifically, the system amplifies light without monitoring light input to and output from the semiconductor amplifier. As a result, light output from the semiconductor amplifier is not stable, causing-the reception level at a receiving section to fluctuate over a broad range.

SUMMARY OF THE INVENTION

It is, therefore, an object of the present invention to provide an optical semiconductor amplifier capable of controlling an optical amplification on a feedback principle by monitoring input light and output light.

It is another object of the present invention to provide an optical semiconductor amplifier which is simple and miniature and, in addition, suitable for circuit integration.

An optical semiconductor amplifier of the present invention comprises an input optical waveguide medium for feeding input light. A first optical branching circuit which is included in a first optical coupler splits the input light into two. An optical semiconductor amplifier amplifies one of two light split by the first optical branching circuit. A first photodetector receives the other of the two light and generates a corresponding first electric signal. A second optical branching circuit which is included a second optical coupler splits the light amplified by the optical semiconductor amplifier into two. A second photodetector receives one of two light split by the second optical branching circuit, and generates a corresponding second electric signal. An output optical waveguide receives the other of the two light split by the second optical branching circuit. A feedback control circuit controls an injection current to the optical semiconductor amplifier in response to the first and second signals.

BRIEF DESCRIPTION OF THE DRAWINGS

The above and other objects, features and advantages of the present invention will become more apparent from the following detailed description taken with the accompanying drawings in which.

DETAILED DESCRIPTION OF THE PREFERRED EMBODIMENTS

Figure 1:
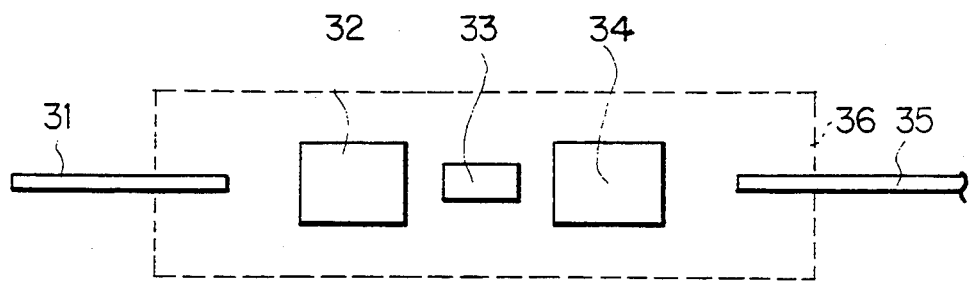
FIG. 1 shows a conventional optical semiconductor amplifier.

To better understand the present invention, a brief reference will be made to a conventional optical semiconductor amplifier, shown in FIG. 1. As shown, an optical signal coming out of an input optical fiber 31 is focused by a lens 32 onto an optical semiconductor amplifier element 33. The amplifier element 33 may be implemented by an InP or GaAs semiconductor taught in, e.g., "High-gain, polarization-independent semiconductor optical amplifier with a large optical cavity and angled buried facets", 1990 Technical Digest of Optical Amplifiers and Their Applications (Aug. 6-8, 1990), PdP 5-1 by S. Tsuji, T. Toyonaka, M. Haneda and Y. Ono. The amplifier element 33 is driven by an injection current electron population inversion. On receiving the input light, the amplifier element 33 performs optical amplification due to stimulated radiation. The amplified optical signal is propagated through a lens 34 to an output optical fiber 35. The lens 32, amplifier element 33 and lens 34, as well as the ends of the optical fibers 31 and 35, are accommodated in a casing 36.

Figure 2:
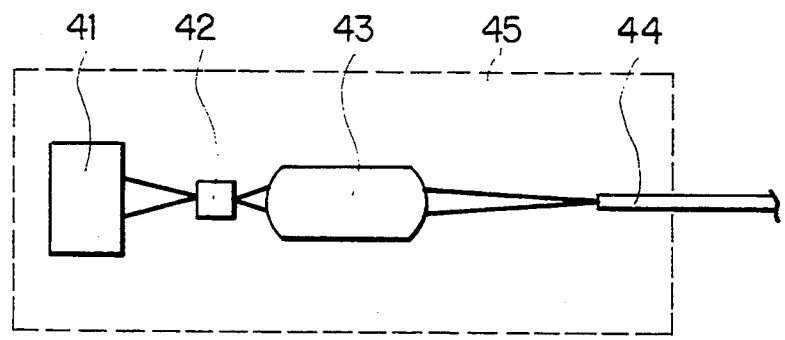
FIG. 2 shows a semiconductor laser diode module.

FIG. 2 shows a semiconductor laser diode module for converting an electric signal to an optical signal to thereby output light from an optical fiber. Such a module is extensively used as an electro-optic signal converter in an optical fiber communication system. As shown, the semiconductor laser diode module is made up of a photodetector 41, a semiconductor laser diode 42, a lens 43, an optical fiber 44, and a casing 45. The laser diode 42 oscillates due to stimulated radiation caused by an injection current, and due to the feedback in the semiconductor. Light issuing from the front end of the laser diode 42 is condensed and optically coupled to the optical fiber 44 by the lens 43. On the other hand, light issuing from the rear end of the laser diode 42 is incident on the photodetector 41. The intensity of light from the laser diode 42 depends on the value of an injection current. The light intensity to current value characteristic changes with a change in environment and due to aging. Since the intensity of light output from the fiber 44 is maintained constant or variable, the injection current is controlled by monitoring the intensity of light incident on the photodetector 41.

By disposing an optical amplifier on the transmission path of an optical fiber communication system as an optical repeater, it is possible to amplify the level of an optical signal having been attenuated by losses particular to the path without converting it to an electric signal. The gain of the optical level of output light to that of input light is determined by the optical level of the input light and the injection current and is, generally, 10-30 dB. The prerequisite with an optical fiber communication system is that the level of light issuing from an optical repeater be maintained constant against the varying environment and aging. Another prerequisite is that the light level be freely variable for system control. However, since the optical amplifier element of an optical amplifier has one end thereof assigned to input and the other end to output, it is impossible to monitor the output light by receiving the light from one end directly with a photodetector, as would be done with a semiconductor laser diode module. It has been customrary to amplify light input to an optical amplifier element without monitoring either the level of the input light or that of the output light. As a result, the gain is not stable due to the varying environment and aging, preventing the optical output level from remaining constant.

Figure 3:
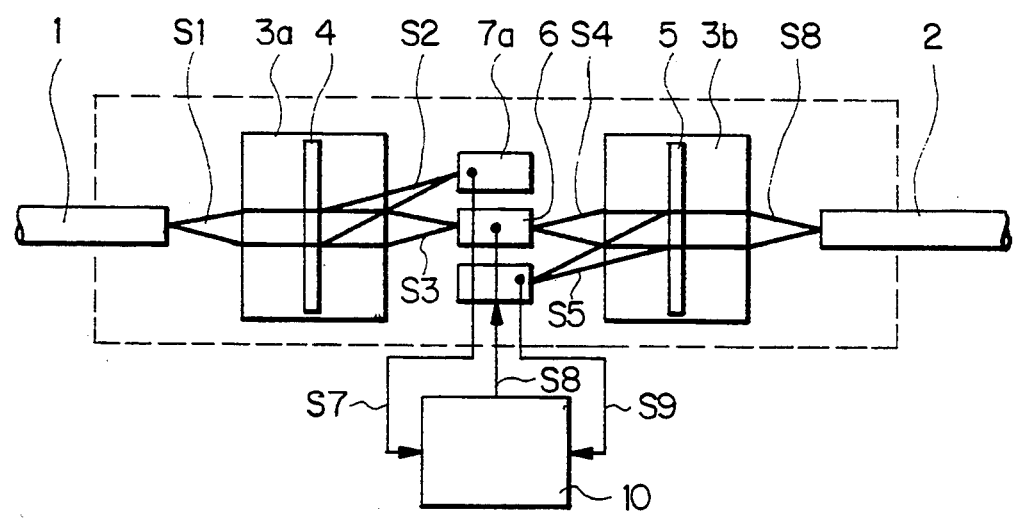
FIG. 3 shows an optical semiconductor amplifier in accordance with the present invention.

Referring to FIG. 3, the general arrangement of an optical semiconductor amplifier in accordance with the present invention is shown. As shown, an optical signal S1 coming out of an input optical waveguide medium or an optical fiber 1 is input to optical coupler 3a which includes optical branching circuit 4. The optical branching circuit splits the optical signal S1 into two optical signals S2 and S3. The signal S2 is applied to a photodetector 7a which then generates a corresponding electric signal S7. On the other hand, the signal S3 is incident to an optical amplifier element 6 which has been driven by an injection current S8 from a control circuit 10. As a result, the amplifier element 6 amplifies the input optical signal S3 to produce an amplified optical signal S4. This optical signal S4 is applied to optical coupler 3b. In the coupler 3b, optical branching circuit 5 splits the input signal S4 into optical signals S5 and S6. The optical signal S5 is fed to a photodetector 7b. On receiving the optical signal S5, the photodetector 7b produces a corresponding electric signal S9. The other optical signal S6 is applied to an output optical waveguide medium 2 or an optical fiber. The electric signals S7 and S9 both are delivered to the control circuit 10. The control circuit 10 compares the electric signals S7 and S9 to calculate the gain of the amplifier element 6 which will provide the optical signal S6 with an adequate optical level. Then, the control circuit 10 applies an injection current S8 matching the calculated gain to the amplifier element 6.

Figure 4:
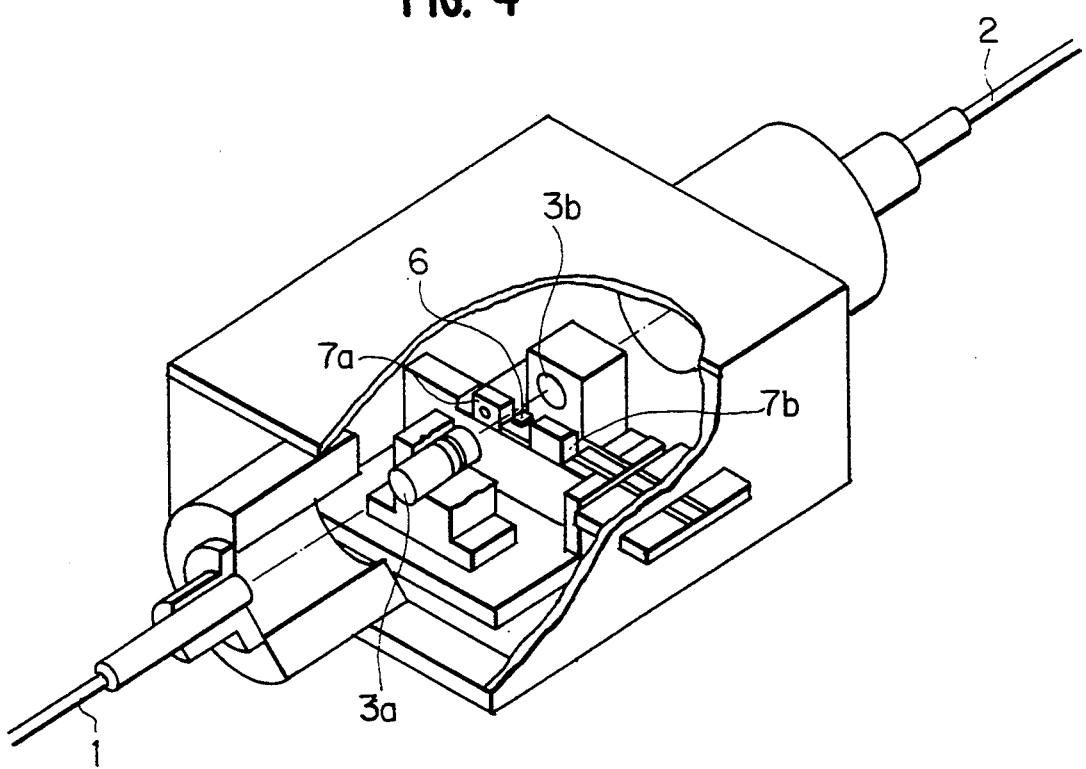
FIG. 4 is a perspective view showing a first embodiment of the optical semiconductor amplifier in accordance with the present invention.
Figure 5:
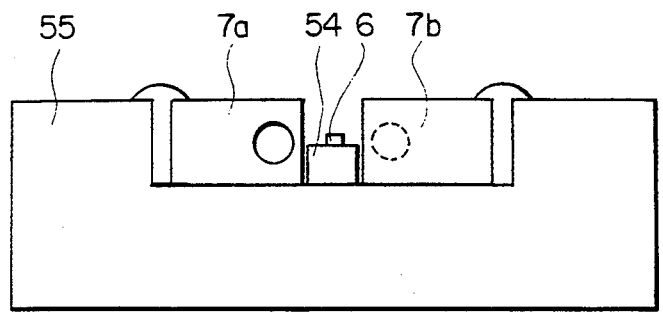
FIG. 5 is a fragmentary enlarged view of part of the amplifier of FIG. 4 where an optical semiconductor amplifier element is mounted.

FIG. 4 is a perspective view showing a first embodiment of the optical semiconductor amplifier in accordance with the present invention. FIG. 5 is a fragmentary enlarged view of part of the embodiment where an optical semiconductor element is mounted. In FIG. 4, optical fibers 1 and 2 are each implemented as a single mode fiber whose core diameter is 10 μm. The ends of the fibers 1 and 2 are obliquely ground to 8 degrees and, in addition, provided with AR coatings so as to suppress reincident reflection light. An optical amplifier element 6 is affixed to the top of a heat sink 54 which is positioned at the center of the upper surface of a stem 55. Semiconductor photodetectors 7a and 7b for monitoring input light and output light, respectively, are located on both sides of the amplifier element 6. The amplifier element 6 is made of an InP semiconductor and has an amplification wavelength of 1.3 μm. The photodetectors 7a and 7b are made of a GaInP semiconductor, with a light receiving diameter of 80 μm. The amplifier element 6 is spaced 800 μm from each of the photodetectors 7a and 7b.

Optical coupler 3a implemented as a lens optically couples the fiber 1 to the amplifier element 6. The lens 3a is constituted by a non-spherical lens having a diameter of 2 mm. The lens 3a has NA of 0.5, as measured at the end thereof facing the amplifier element 6, and has an image magnification of about 1:5. A transparent grating, or diffraction grating, 4 is inserted in the lens 3a. The grating 4 has a primary diffraction of 20% to a wavelength of 1.3 μm and a diffraction angle of 15 degrees.

A lens 3b optically couples the amplifier element 6 to the output optical fiber 2. The lens 3b is identical in characteristic with the lens 3a and symmetrical to the lens 3a with respect to the amplifier element 6. An interference film type half-mirror 5 (not shown) is inserted in the lens 3b and has a reflectance of 1% to a wavelength of 1.3 μm. The half-mirror 5 is inclined about 7.5 degrees to the optical axis and positioned such that a reflection is coupled to the photodetector 7b. The coupling loss of the fiber 1 and amplifier element 6 and the coupling loss of the amplifier element 6 and fiber 2 are 4 dB each.

Since the primary diffraction light from the grating 4 is 20%, light whose intensity is about −7 dB of input light is incident to the photodetector 7a. On the other hand, since the gain of the amplifier element 6 is 18 dB and the reflectance of the half-mirror 5 is 1% (−20 dB), light whose intensity is about −2 dB of light incident to the amplifier element 6 is incident to the photodetector 7b. The main signal loss is 10.5 dB. It includes grating transmission loss of 2 dB (insertion loss: 1 dB+branching loss: 1 dB), input lens coupling loss of 4 dB, half-mirror transmission loss of 0.5 dB (branching loss is negligible) and output lens coupling loss of 4 dB.

On the other hand, signal gain by the amplifier element 6 is 18 dB. Therefore, the gain of the entire amplifier is 7.5 dB (input filter to output filter gain).

The optical signals monitored by the photodetectors 7a and 7b are respectively converted to the electric signals S7 and S9 and then-applied to the control circuit 10. In response, the control circuit 10 monitors the input signals S7 and S9 such that the intensity of light not undergone amplification and that of light undergone amplification remain in a predetermined ratio. When this ratio is changed due to, e.g., a change in ambient temperature, the control circuit 10 controls the injection current S8 to maintain the predetermined gain.

The lenses 3a and 3b, gating 4, half-mirror 5, amplifier element 6, photodetectors 7a and 7b are received in a single package. The package is 14 mm long, 12 mm wide, and 6 mm high and substantially the same in size as an optical amplifier element having no monitors thereinside.

Figure 6:
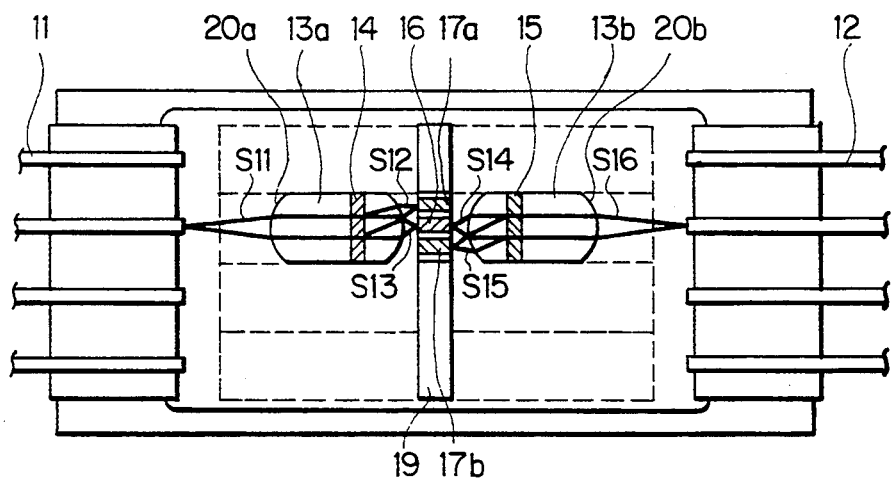
FIGS. 6 and 7 respectively show a second and a third embodiment of the present invention.

FIG. 6 shows a second embodiment of the present invention which is implemented as a flare type optical amplifier having four input optical fibers and four output optical fibers. An optical amplifier element similar to that of the first embodiment is associated with each pair of input and output optical fibers. In this configuration, input light from each input optical fiber can be amplified independently of the other input light. In FIG. 6, only a single optical amplifier element is shown for clarity, and a control circuit is not shown.

Input optical fibers 11 and output optical fibers 12 are each implemented as a single mode fiber having a mode field diameter of 8 μm. An optical semiconductor element 19 has a single InP semiconductor substrate, and four groups of optical amplifier elements 16 and photodetector 17a and 17b monolithically formed on the substrate. In each group, the amplifier element 16 is located at the center while the photodetectors 17a and 17b are located at both sides of and spaced apart 125 um from the element 16. Optical coupler 13a is disposed between the optical fiber 11 and the amplifier element 16 and photodetectors 17a and 17b and constituted by a lens 20a and a diffraction grating 14. The grating 14 diffracts about 20% of an optical signal S11 incident from the fiber 11. The resulting diffraction light signal S12 is coupled to the photodetector 17a to be monitored. The other part S13 of the optical signal S11 is coupled straightforward to the amplifier element 16. The amplifier element 16 amplifies the input signal S13 to produce an amplified optical signal S14. Optical coupling means 13b is disposed between the amplifier element 19 and the optical fiber 12 and also implemented by a lens 20b and a half mirror 15 whose reflectance is 5%. About 1% of the amplified optical signal S14 is reflected by the half mirror 15 to turn out an optical signal S15. This signal S15 is monitored by the photodetector 17b. Light transmitted through the half mirror 15, i.e., an optical signal S16 is output to the fiber 12.

In the second embodiment, as in the first embodiment, the optical fibers 11 and 12, optical coupler 13a and 13b, amplifier element 16 and photodetectors 17a and 17b (semiconductor element 19) are arranged in the same plane. A control circuit compares the electric output signals of the photodetectors 17a and 17b and so controls the injection current to the amplifier element 16 as to maintain the gain thereof constant.

The illustrative embodiment is implemented as an array type optical amplifier in which four amplifiers each having an optical amplifying function are arranged in parallel. The four optical amplifiers are accommodated in a single casing 18. The optical semiconductor element 19 is constituted by a semiconductor having the four groups of amplifier elements 16 and photodetectors 17a and 17b, i.e., twelve elements monolithically formed on a single substrate.

In the first or second embodiment described above, the optical signal monitor located on the input side and including the diffraction grating 14 and photodetector 17a may be omitted, if desired.

Figure 7:
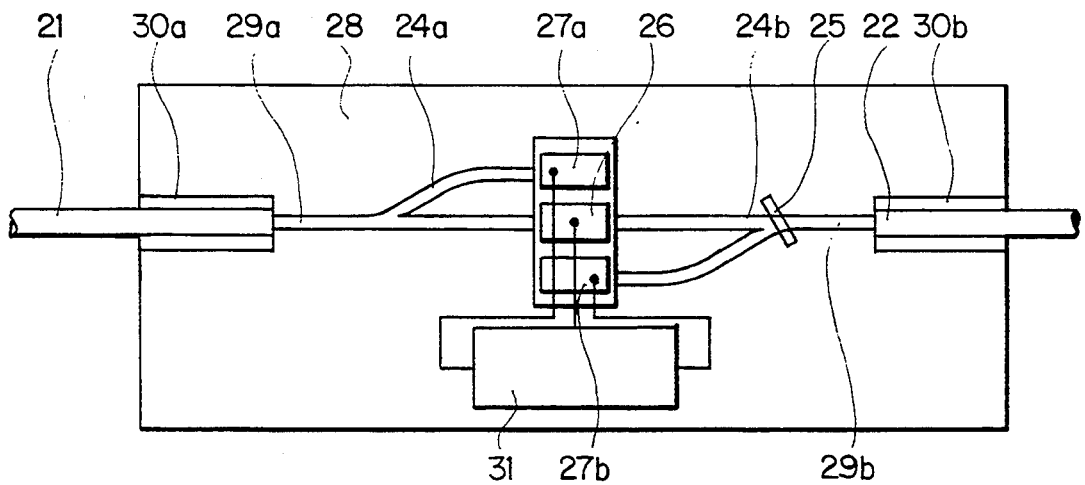

Referring to FIG. 7, a third embodiment of the present invention will be described. As shown, an optical amplifier element 26 and photodetectors 27a and 27b are monolithically formed on a single InP semiconductor substrate, as in the second embodiment. Specifically, such elements are affixed to the center of a silicon substrate 28. Silica optical waveguides 29a and 29b are formed on the surface of the silicon substrate 28 to merge into opposite ends of the amplifier element 26. The silica optical waveguides 29a and 29b are formed by CVD (Chemical Vapor Deposition) and made up of a bottom cladding layer and a top cladding layer which are 10 μm thick each, and a 9 μm thick and 9 μm wide core. The input optical waveguide 29a includes a Y branch portion 24a having a branch angle of about 2 degrees. The branch ratio of the Y branch portion 29a is 9:1; one branch is coupled to the amplifier element 26 while the other branch is coupled to the photodetector 27a. The output optical waveguide 29b also includes a Y branch portion 24b. A half mirror 25 is received in a groove formed in the Y branch portion 24b. The half mirror 25 transmits 99% of incident light while reflecting 1% toward the photodetector 27b. Further, grooves 30a and 30b each having a V-shaped cross-section are formed at opposite ends of the silicon substrate 28 by chemical etching. An input optical fiber 21 and an output optical fiber 22 are received in the grooves 30a and 30b, respectively. The grooves 30a and 30b are connected to the optical waveguides 29a and 29b, respectively.

The optical signals monitored by the photodetectors 27a and 27b are transformed to corresponding electric signals and then sent to a control circuit 31. In response, the control circuit 31 so controls an injection current to the amplifier element 26 as to maintain the gain thereof constant, as in the first embodiment. In accordance with the present invention, an optical amplifier element and photodetectors may be arranged on a waveguide substrate and packaged on a single substrate with optical coupler implemented by optical waveguides having Y branches, as stated above.

In summary, it will be seen that the present invention provides an optical semiconductor amplifier capable of constantly monitoring input and output light and, therefore, controlling an optical amplifier element thereof on a feedback basis. This insures a stable optical level despite the varying environment and aging.

Various modifications will become possible for those skilled in the art after receiving the teachings of the present disclosure without departing from the scope thereof.

What is claimed is:

1. An optical semiconductor amplifier comprising:
   an input optical waveguide medium for feeding input light;
   first optical coupling means including first optical branching means for splitting said input light into a first beam and a second beam;
   optical semiconductor amplifier means for amplifying said first beam;
   first photodetector means for receiving said second beam and generating a corresponding first electric signal;
   second optical coupling means including second optical branching means for splitting a third beam of light into a fourth beam and a fifth beam, wherein said third beam is an amplification of said first beam by said optical semiconductor amplifier element;
   second photodetector means for receiving said fifth beam and generating a corresponding second electric signal;
   an output waveguide medium for receiving said fourth beam; and
   feedback control circuit means for controlling an injection current to said optical semiconductor amplifier means in response to said first electric signal and said second electric signal.

2. An amplifier as claimed in claim 1, wherein said first optical branching means comprises a transparent grating.

3. An amplifier as claimed in claim 1, wherein said first optical branching means comprises a half mirror.

4. An amplifier as claimed in claim 1, wherein said second optical branching means comprises a half-mirror.

5. An amplifier as claimed in claim 1, wherein said optical semiconductor amplifier element and said first and second photodetectors are aligned in a single plane.

6. An amplifier as claimed in claim 1, wherein a plurality of assemblies each comprising said input optical waveguide medium, said first and second optical coupling means, said optical semiconductor amplifier element and said output optical waveguide medium are arranged in parallel.

7. An amplifier as claimed in claim 1, wherein said first and second optical coupling means and said first and second optical branching means thereof are constituted by optical waveguides formed on a single substrate;

said optical semiconductor amplifier element and said first and second photodetectors being arranged on said single substrate.

8. An amplifier as claimed in claim 1, wherein at least one of said input optical waveguide medium and said output optical waveguide medium comprises an optical fiber.

9. An amplifier as claimed in claim 1, wherein at least one of said input optical waveguide medium and said output optical waveguide medium comprises an optical waveguide formed on a substrate.

10. An amplifier as claimed in claim 1, wherein said input optical waveguide medium and said output optical waveguide medium comprise optical waveguides formed on a single substrate.

said first optical coupling means, said optical semiconductor amplifier element, said first photodetector, said second optical coupling means and said second photodetector being provided on said substrate.

11. An amplifier as claimed in claim 10, wherein said substrate comprises a silicon substrate, said optical waveguides comprising a core made of silicon dioxide deposited on said substrate.

12. An amplifier as claimed in claim 10, wherein said first optical branching means comprises an optical waveguide formed on said substrate and including a Y branch portion.

13. An amplifier as claimed in claim 10, wherein said second optical branching means comprises an optical waveguide formed on said substrate and including a Y branch portion, and a half mirror positioned at said Y branch portion.

14. An amplifier as claimed in claim 9, wherein said input optical waveguide and said output optical waveguide are respectively optically coupled to an input optical fiber and an output optical fiber located outside of said optical semiconductor amplifier.

15. An amplifier as claimed in claim 14, wherein said input optical fiber and said output optical fiber are each received in a groove formed in said substrate.

16. An amplifier as claimed in claim 9, wherein said feedback control circuit is provided on said substrate.

17. An optical semiconductor amplifier comprising:
an input optical waveguide medium for feeding input light;
optical semiconductor amplifier means for amplifying a beam of said input light;
photodetector means for receiving a part of said beam of said input light and generating a corresponding electric signal;
an output optical waveguide medium for receiving an amplified beam of said input light from said optical semiconductor amplifier means; and
feedback control circuit means for controlling an injection current to said optical semiconductor amplifier means in response to said electric signal.

18. An optical semiconductor amplifier comprising:
an input optical waveguide medium for feeding input light;
optical semiconductor amplifier means for amplifying at least a first part of a beam of said input light;
first photodetector means for receiving a second part of said beam of said input light and generating a corresponding first electric signal;
second photodetector means for receiving a first part of an amplified beam of said input light from said optical semiconductor amplifier means and generating a corresponding second electric signal;
an output optical waveguide medium for receiving a second part of said amplified beam of said input light from said optical semiconductor amplifier means; and
feedback control circuit means for controlling an injection current to said optical semiconductor amplifier means in response to said first electric signal and said second electric signal.

* * * * *